(12) United States Patent
Yoon et al.

(10) Patent No.: US 8,263,487 B2
(45) Date of Patent: Sep. 11, 2012

(54) METHOD OF FORMING PATTERNS OF SEMICONDUCTOR DEVICE

(75) Inventors: Dong-ki Yoon, Seoul (KR); Shi-yong Yi, Hwaseong-si (KR); Seong-woon Choi, Suwon-si (KR); Seok-hwan Oh, Suwon-si (KR); Kwang-sub Yoon, Yongin-si (KR); Myeong-cheol Kim, Suwon-si (KR); Young-ju Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 352 days.

(21) Appl. No.: 12/655,344

(22) Filed: Dec. 29, 2009

(65) Prior Publication Data

US 2010/0248492 A1 Sep. 30, 2010

(30) Foreign Application Priority Data

Dec. 31, 2008 (KR) ........................ 10-2008-0138548

(51) Int. Cl.
*H01L 21/4763* (2006.01)
(52) U.S. Cl. ........ 438/618; 438/622; 438/694; 438/696; 438/700; 438/702
(58) Field of Classification Search ........................ None
See application file for complete search history.

(56) References Cited

U.S. PATENT DOCUMENTS

| | | | |
|---|---|---|---|
| 6,316,169 B1 * | 11/2001 | Vahedi et al. | 430/329 |
| 6,605,541 B1 * | 8/2003 | Yu | 438/700 |
| 6,677,240 B1 * | 1/2004 | Tigelaar | 438/700 |
| 7,202,174 B1 * | 4/2007 | Jung et al. | 438/694 |
| 7,601,647 B2 | 10/2009 | Jeon et al. | |
| 2008/0188083 A1 | 8/2008 | Jeon et al. | |
| 2008/0233726 A1 | 9/2008 | Jun et al. | |

FOREIGN PATENT DOCUMENTS

| | | |
|---|---|---|
| KR | 10-2007-0093177 A | 9/2007 |
| KR | 10-0843236 B1 | 6/2008 |
| KR | 10-0843899 B1 | 6/2008 |

* cited by examiner

*Primary Examiner* — Duy Deo
(74) *Attorney, Agent, or Firm* — Onello & Mello, LLP

(57) ABSTRACT

A method of forming fine patterns of a semiconductor device by using carbon (C)-containing films includes forming an etching target film on a substrate including first and second regions; forming a plurality of first C-containing film patterns on the etching target film in the first region; forming a buffer layer which covers top and side surfaces of the plurality of first C-containing film patterns; forming a second C-containing film; removing the second C-containing film in the second region; exposing the plurality of first C-containing film patterns by removing a portion of the buffer layer in the first and second regions; and etching the etching target film by using the plurality of first C-containing film patterns, and portions of the second C-containing film which remain in the first region, as an etching mask.

9 Claims, 19 Drawing Sheets

METHOD OF FORMING PATTERNS OF SEMICONDUCTOR DEVICE

CROSS-REFERENCE TO RELATED APPLICATIONS

This application claims the benefit under 35 U.S.C. 119 of Korean Patent Application No. 10-2008-0138548, filed on Dec. 31, 2008, in the Korean Intellectual Property Office, the entire contents of which are incorporated herein by reference.

BACKGROUND

The inventive concept relates to a method of forming patterns of a semiconductor device, and more particularly, to a method of forming a plurality of fine pitch patterns by using a double patterning process so as to exceed the resolution limits of typical exposure equipment.

Fine patterns are essential when manufacturing highly integrated semiconductor devices. In order to integrate a large number of devices within a small region, an individual device should be formed as small as possible and, for this, a pitch of a pattern to be formed should be small. Currently, as design rules of semiconductor devices are being greatly reduced, in a photolithography process for forming patterns required to realize a semiconductor device, it is difficult to form fine pitch patterns due to a resolution limit. In particular, when performing a photolithography process for forming line and space (L/S) patterns on a substrate, it is difficult to form a plurality of fine pitch patterns due to the resolution limit.

In order to cope with the resolution limit in a photolithography process, methods of forming fine pitch hardmask patterns by using a double patterning process have been suggested. However, these processes have high manufacturing costs due to expensive equipment, and are also time consuming. Also, when an etching mask material is vapor-deposited in an aperture region having a larger aspect ratio in a double patterning process, defects such as voids may occur.

SUMMARY

The inventive concept provides a method of forming etching mask patterns by using a double patterning process, which reduces manufacturing costs, reduces the time required for the double patterning process, and prevents defects such as voids from occurring.

According to an aspect of the inventive concept, there is provided a method of forming patterns of a semiconductor device, the method including forming an etching target film on a substrate comprising first and second regions; forming a plurality of first carbon (C)-containing film patterns on the etching target film in the first region; forming a buffer layer which covers top and side surfaces of the plurality of first C-containing film patterns and in which a plurality of recesses are formed in a top surface thereof between the first C-containing film patterns; forming a second C-containing film on the buffer layer in the first and second regions so as to fill the plurality of recesses; exposing the buffer layer in the second region by removing the second C-containing film in the second region; exposing the plurality of first C-containing film patterns by removing a portion of the buffer layer in the first and second regions; and forming a plurality of etching target film patterns by etching the etching target film by using the plurality of first C-containing film patterns, and portions of the second C-containing film, which are filled in the plurality of recesses, as an etching mask.

The forming of the second C-containing film may include forming the second C-containing film so as to fill the plurality of recesses and to completely cover the buffer layer in the first and second regions. The exposing of the buffer layer in the second region by removing the second C-containing film in the second region may include forming a trimming mask pattern on the second C-containing film in the first region; etching the second C-containing film in the second region by using the trimming mask pattern as an etching mask; and exposing the second C-containing film in the first region by removing the trimming mask pattern. Also, after removing the trimming mask pattern, the method may further include forming a plurality of second C-containing film patterns so as to be separately disposed in the plurality of recesses by removing a portion of the second C-containing film in the first region from a top surface of the second C-containing film, before exposing the plurality of first C-containing film patterns by removing the portion of the buffer layer, and the plurality of first C-containing film patterns and the plurality of second C-containing film patterns may be used as an etching mask when the etching target film is etched.

Also, the forming of the second C-containing film may include forming the second C-containing film so as to fill the plurality of recesses and to completely cover the buffer layer in the first and second regions. The exposing of the buffer layer in the second region by removing the second C-containing film in the second region may include forming a plurality of second C-containing film patterns so as to be separately disposed in the plurality of recesses in the first region and to be disposed on the buffer layer in the second region, by removing a portion of the second C-containing film in the first and second regions from a top surface of the second C-containing film; forming a trimming mask pattern on the second C-containing film and the buffer layer in the first region; etching the second C-containing film patterns in the second region by using the trimming mask pattern as an etching mask; and exposing the second C-containing film patterns and the buffer layer in the first region by removing the trimming mask pattern. The plurality of first C-containing film patterns, and the second C-containing film patterns in the first region are used as an etching mask when the etching target film is etched. The exposing of the plurality of first C-containing film patterns by removing the portion of the buffer layer may be continuously performed in-situ after removing the trimming mask pattern. Here, an etching process for removing the portion of the buffer layer and an etching process for removing the trimming mask pattern may be performed under the same etching condition.

Also, the exposing of the buffer layer in the second region by removing the second C-containing film in the second region may include etching the second C-containing film in the second region by using a trimming mask pattern which covers the second C-containing film in the first region, as an etching mask. In this case, the trimming mask pattern may include a photoresist material containing silicon (Si).

Also, the plurality of first C-containing film patterns and the second C-containing film include the same material.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
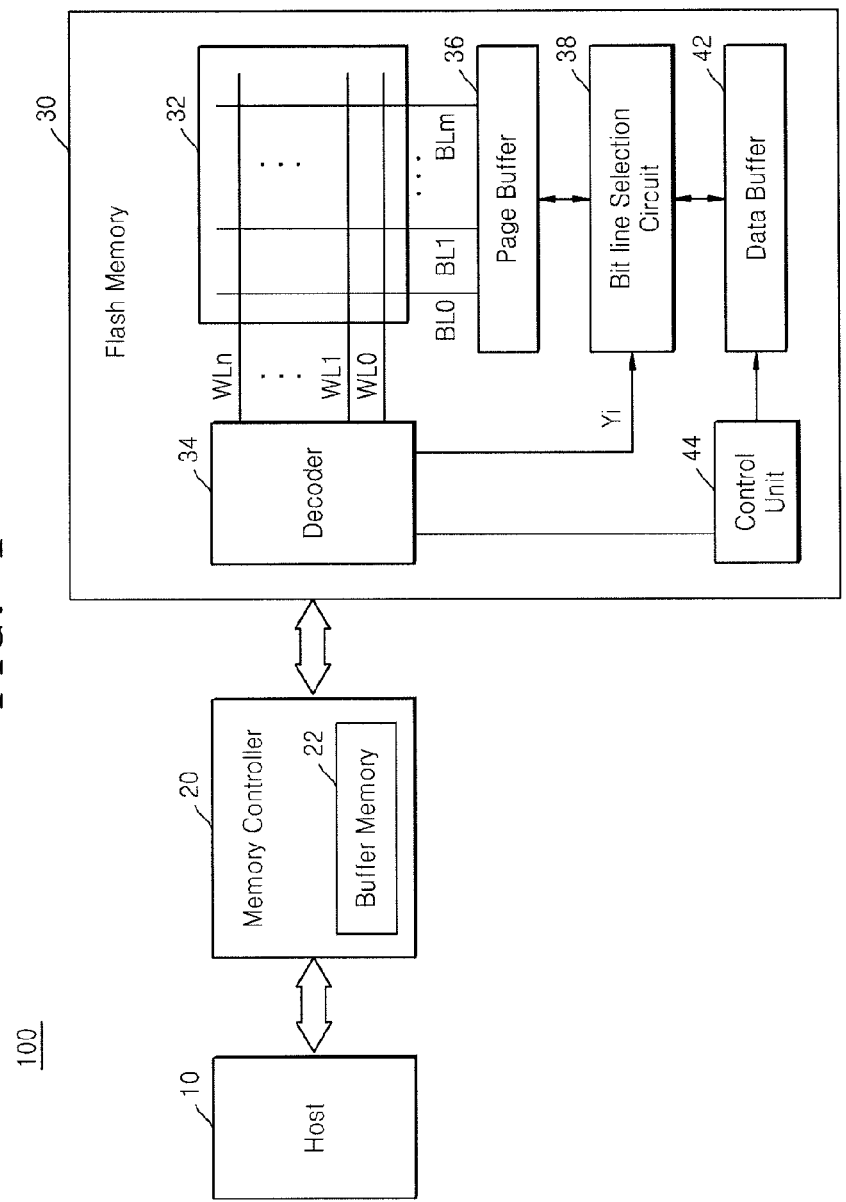
FIG. 1 is a block diagram of a memory system of a semiconductor device according to an embodiment of the inventive concept.

Hereinafter, the inventive concept will be described in detail through description of exemplary embodiments of the inventive concept with reference to the attached drawings. The inventive concept may, however, be embodied in many different forms and should not be construed as being limited to the embodiments set forth herein; rather, these embodiments are provided so that this description will be thorough and complete, and will fully convey the concept of the inventive concept to one of ordinary skill in the art. In the drawings, the thicknesses of layers and regions are exaggerated for clarity and like reference numerals denote like elements. Also, various elements and regions are schematically illustrated in the drawings and thus the inventive concept is not limited to relative sizes and distances shown therein.

FIG. 1 is a block diagram of a memory system 100 of a semiconductor device according to an embodiment of the inventive concept.

Referring to FIG. 1, the memory system 100 of the semiconductor device includes a host 10, a memory controller 20, and a flash memory 30.

The memory controller 20 functions as an interface between the host 10 and the flash memory 30 and includes a buffer memory 22. Although not illustrated in FIG. 1, the memory controller 20 may further include a central processing unit (CPU), read-only memory (ROM), random-access memory (RAM), and interface blocks.

The flash memory 30 may include a cell array 32, a decoder 34, a page buffer 36, a bit line selection circuit 38, a data buffer 42, and a control unit 44.

Data and a write command are input from the host 10 to the memory controller 20, and the memory controller 20 controls the flash memory 30 according to the write command such that the data is written in the cell array 32. Also, according to a read command input from the host 10, the memory controller 20 controls the flash memory 30 such that data stored in the cell array 32 is read. The buffer memory 22 temporarily stores data transmitted between the host 10 and the flash memory 30.

The cell array 32 of the flash memory 30 is composed of a plurality of memory cells. The decoder 34 is connected to the cell array 32 through a plurality of word lines WL0 through WLn. The decoder 34 receives an address from the memory controller 20, and selects one of the word lines WL0 through WLn or generates a selection signal Yi to select one of a plurality of bit lines BL0 through BLm. The page buffer 36 is connected to the cell array 32 through the bit lines BL0 through BLm.

Figure 2:
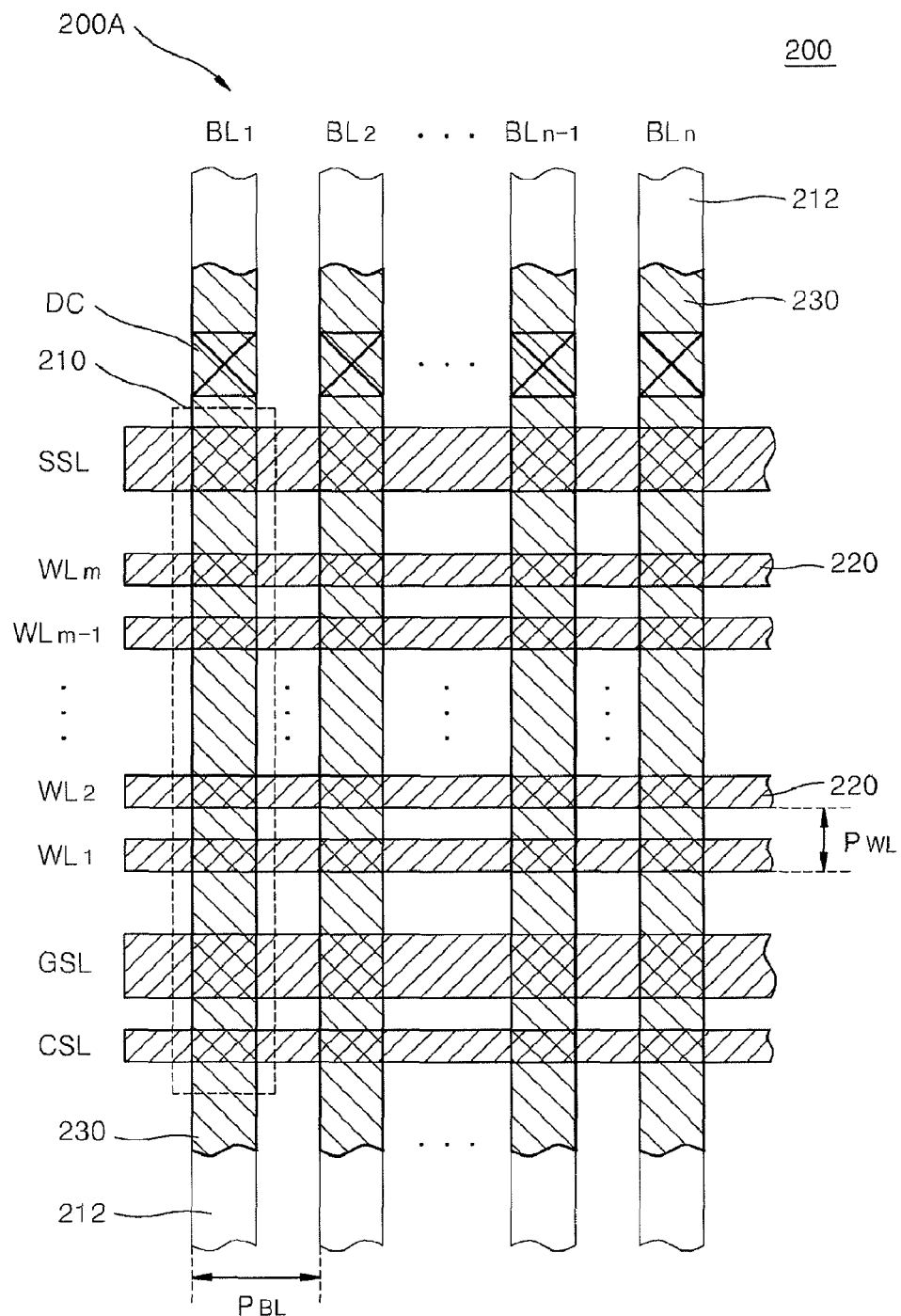
FIG. 2 illustrates layouts of unit devices that may be formed by using a method of forming fine patterns of a semiconductor device, according to an embodiment of the inventive concept.

FIG. 2 illustrates layouts of unit devices that may be formed by using a method of forming fine patterns of a semiconductor device, according to an embodiment of the inventive concept.

FIG. 2 illustrates a layout of a portion of a memory cell array 200 of a semiconductor device including various patterns that may be formed by using a method of forming fine patterns of a semiconductor device, according to an embodiment of the inventive concept. The memory cell array 200 may form the cell array 32 of the flash memory 30 illustrated in FIG. 1.

Referring to FIG. 2, the memory cell array 200 may include a plurality of memory cell blocks 200A each of which is composed of a plurality of memory cells. Only one memory cell block 200A is illustrated in FIG. 2.

The memory cell block 200A of the memory cell array 200 includes a plurality of word lines WL1 through WLm 220 and a plurality of bit lines BL1 through BLn 230. The memory cell block 200A of the memory cell array 200 includes a plurality of cell strings 210 formed between the bit lines BL1 through BLn 230 and a common source line (CSL). Each of the cell strings 210 includes a plurality of memory cells which are connected to each other in series. Gate electrodes of a plurality of memory cells included in one cell string 210 separately contact the word lines WL1 through WLm 220. A ground selection transistor connected to a ground selection line (GSL) and a string selection transistor connected to a string selection line (SSL) are respectively disposed at both ends of the cell strings 210.

Each of the bit lines BL1 through BLn 230 extends along an active region 212 in parallel with the active region 212 and has almost the same line width as the active region 212. The bit lines BL1 through BLn 230 are respectively electrically connected to a plurality of active regions 212 in direct contact (DC).

The word lines WL1 through WLm 220 are arranged in a pattern having a predetermined pitch $P_{WL}$ and the bit lines BL1 through BLn 230 are arranged in a pattern having a predetermined pitch $P_{BL}$.

FIG. 2 illustrates a case when the active regions 212 and the bit lines BL1 through BLn 230 are arranged to overlap each other in a plan view and are formed in a pattern having the same pitch.

FIGS. 3A and 3B through 14A and 14B are plan views and cross-sectional views illustrating a method of forming patterns of a semiconductor device, according to an embodiment of the inventive concept. FIGS. 3A and 3B through 14A and 14B illustrate a process of forming the word lines WL1 through WLm 220 included in the memory cell block 200A of the memory cell array 200 illustrated in FIG. 2. However, the inventive concept is not limited to the process of forming the word lines WL1 through WLm 220 and may also be applied to a process of forming the bit lines BL1 through BLn 230 or the active regions 212 illustrated in FIG. In particular, FIGS. 3A, 4A, . . . , 14A are plan views illustrating a piece of an edge portion of the memory cell array 200 illustrated in FIG. 2, and FIGS. 3B, 4B, . . . , 14B are cross-sectional views of the memory cell array 200 taken along lines B-B' indicated in FIGS. 3A, 4A, . . . , 14A, respectively.

Figure 3A:
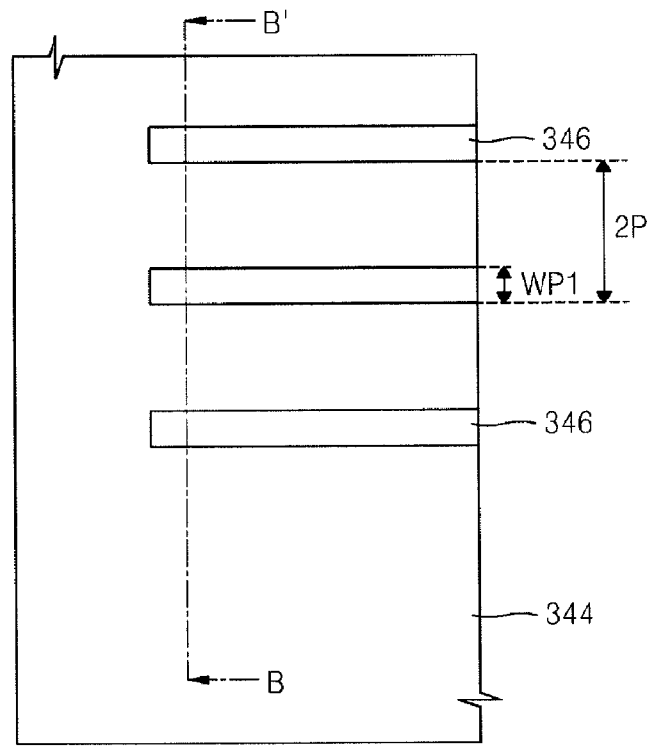
FIGS. 3A, 4A, 5A, 6A, 7A, 8A, 9A, 10A, 11A, 12A, 13A and 14A are plan views illustrating a method of forming patterns of a semiconductor device, according to an embodiment of the inventive concept.
Figure 3B:
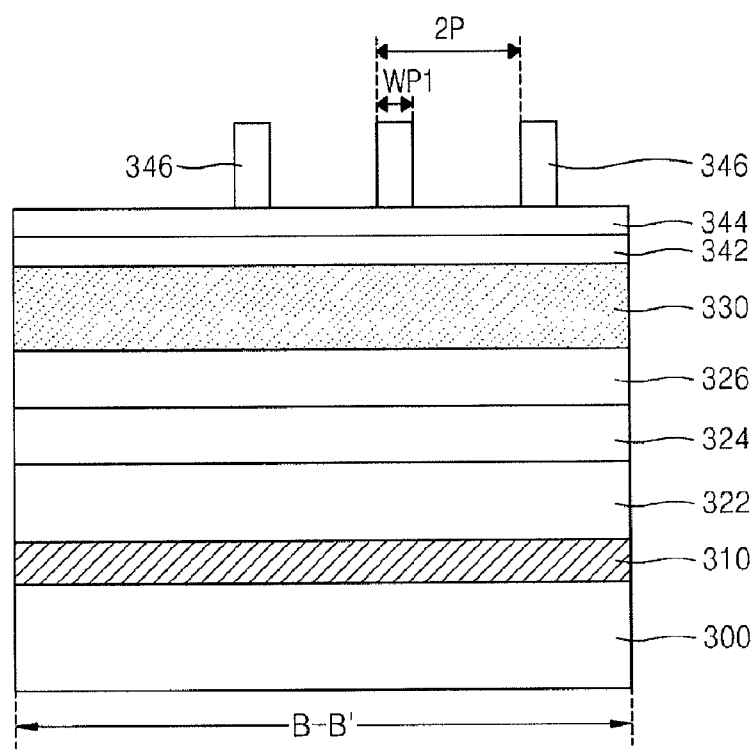
FIGS. 3B, 4B, 5B, 6B, 7B, 8B, 9B, 10B, 11B, 12B, 13B and 14B are cross-sectional views taken along line B-B' of FIGS. 3A, 4A, 5A, 6A, 7A, 8A, 9A, 10A, 11A, 12A, 13A and 14A, respectively.

Referring to FIGS. 3A and 3B, an etching target film 310 is formed on a substrate 300. The substrate 300 may be a silicon (Si) substrate. The etching target film 310 may be a layer for forming conductive lines such as the word lines WL1 through WLm 220 or the bit lines BL1 through BLn 230 illustrated in FIG. 2.

First through third hardmask layers 322, 324, and 326 are sequentially formed on the etching target film 310.

The etching target film 310 may be formed of impurity-doped polysilicon, metal, metal nitride, or a mixture thereof. For example, if the etching target film 310 is formed into word lines, the etching target film 310 may contain a material selected from the group consisting of TaN, TiN, W, WN, HfN, and WSix, or a conductive material formed of a mixture thereof. Alternatively, if the etching target film 310 is formed into bit lines, the etching target film 310 may be formed of impurity-doped polysilicon or metal.

Each of the first through third hardmask layers 322, 324, and 326 may contain a material selected from the group consisting of an oxide film, a nitride film, and a polysilicon film. The first hardmask layer 322 may be formed of a material having an etch selectivity provided according to a material of the etching target film 310. The second hardmask layer 324 may be formed of a material having an etch selectivity different from that of the first hardmask layer 322, and the third hardmask layer 326 may be formed of a material having an etch selectivity different from that of the second hardmask layer 324. The first hardmask layer 322 may be an oxide film, a nitride film, or a mixture thereof. If the first hardmask layer 322 is an oxide film, the first hardmask layer 322 may be at least one material selected from the group consisting of a thermal oxide film, a CVD oxide film, a undoped silicate glass (USG) film, and a high density plasma (HDP) oxide film. Alternatively, the first hardmask layer 322 may be a nitride film such as a SiON film, a SiN film, a SiBN film, or a BN film. The second hardmask layer 324 may be formed of polysilicon and the third hardmask layer 326 may be an oxide film. However, the inventive concept is not limited thereto. In some cases, one or two of the first through third hardmask layers 322, 324, and 326 may be omitted.

A first carbon (C)-containing film 330 is formed on the third hardmask layer 326.

The first C-containing film 330 may be formed of a hydrocarbon compound containing an aromatic ring or an organic compound containing a derivative thereof. For example, the first C-containing film 330 may be formed of an organic compound containing an aromatic ring such as phenyl, benzene, or naphthalene. The first C-containing film 330 is a film having a relatively high C content of about 85~99 weight % of an organic compound forming the first C-containing film 330. For example, the first C-containing film 330 may be obtained from a carbon spin-on-hardmask (C-SOH) produced by Cheil Industries Inc. in the Republic of Korea.

The first C-containing film 330 may be formed by using, for example, a spin coating process. The first C-containing film 330 may be formed by spin-coating an organic compound on the third hardmask layer 326 to a thickness of about 1000~5000 Å, and baking the organic compound layer at about 150~350° C. in a primary baking process so as to form the first C-containing film 330. The primary baking process may be performed for about 60 sec. Then, the first C-containing film 330 is baked at about 300~550° C. in a secondary baking process so as to be cured. The secondary baking process may be performed for about 30~300 sec. By curing the first C-containing film 330 as described above, even if a vapor deposition process is performed at a relatively high temperature of about 400° C. or above when another film is formed on the first C-containing film 330, the vapor deposition process does not have an adverse effect on the first C-containing film 330.

A fourth hardmask layer 342 and an antireflection film 344 are sequentially formed on the first C-containing film 330, and then a plurality of photoresist patterns 346 having a predetermined pitch are formed on the antireflection film 344.

The fourth hardmask layer 342 may be formed by using a chemical vapor deposition (CVD) process or a spin coating process. For example, the fourth hardmask layer 342 may be a SiON film or a spin-coated film containing Si and C. The antireflection film 344 may be an organic antireflection film.

The photoresist patterns 346 may be formed to have a first pitch 2P that is twice the size of a fine pitch P of ultimate patterns to be formed. Also, a width WP1 of each of the photoresist patterns 346 may be equal to or greater than a width of the ultimate patterns to be formed on the substrate 300.

Figure 4A:
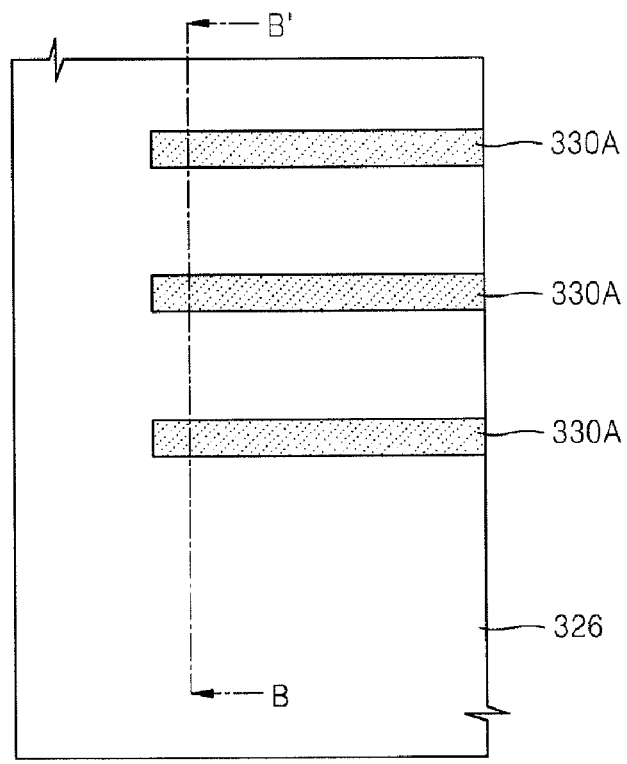
Figure 4B:
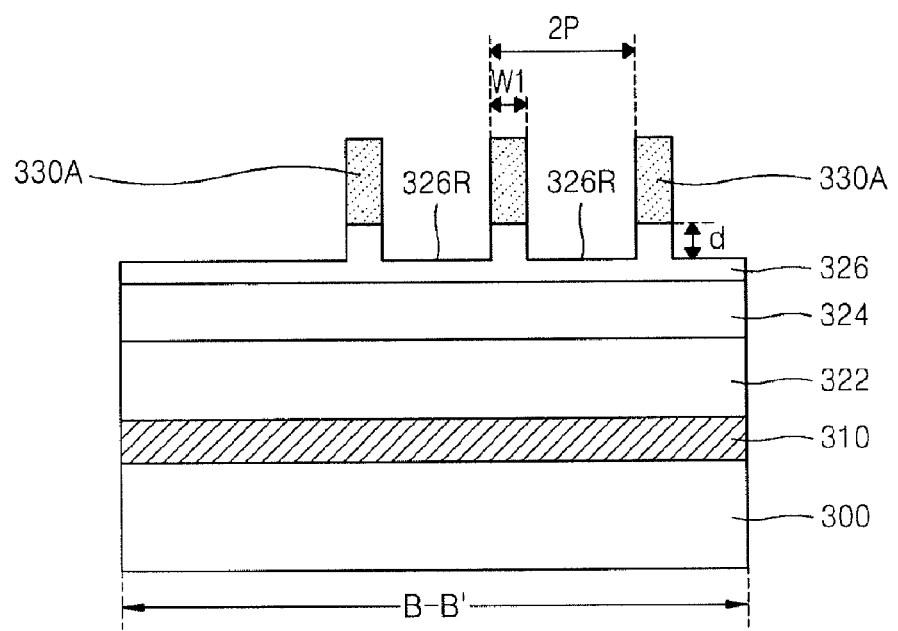

Referring to FIGS. 4A and 4B, a plurality of first C-containing film patterns 330A are formed by sequentially etching the antireflection film 344, the fourth hardmask layer 342, and the first C-containing film 330 by using the photoresist patterns 346 as an etch mask. Then, unnecessary films remaining on the first C-containing film patterns 330 are removed.

Although top surfaces of the first C-containing film patterns 330A are exposed in FIGS. 4A and 4B, in some cases, some of the fourth hardmask layer 342 may remain on the first C-containing film patterns 330A.

The first C-containing film patterns 330A may be formed to have the first pitch 2P that is twice the fine pitch P of the ultimate patterns to be formed, in correspondence with the photoresist patterns 346. Also, a first width W1 of each of the first C-containing film patterns 330A may be designed to be equal to or greater than a quarter of the first pitch 2P and to be less than a half of the first pitch 2P.

After the first C-containing film patterns 330A are formed, exposed portions of the third hardmask layer 326 around the first C-containing film patterns 330A may be removed from a top surface of the third hardmask layer 326 by performing over etching under the same condition used when the first C-containing film 330 is etched, so as to form low surface portions 326R on the third hardmask layer 326. The removed portion has a first thickness d. Alternatively, in order to form the low surface portions 326R on the third hardmask layer 326, after the first C-containing film patterns 330A are formed, the exposed portions of the third hardmask layer 326 may be removed under a new condition. The first thickness d may have the same value as the first width W1 of the first C-containing film patterns 330A. Alternatively, if necessary, the first thickness d may have a value less than or greater than the first width W1 of the first C-containing film patterns 330A. In some cases, a process of forming the low surface portions 326R may be omitted.

Figure 5A:
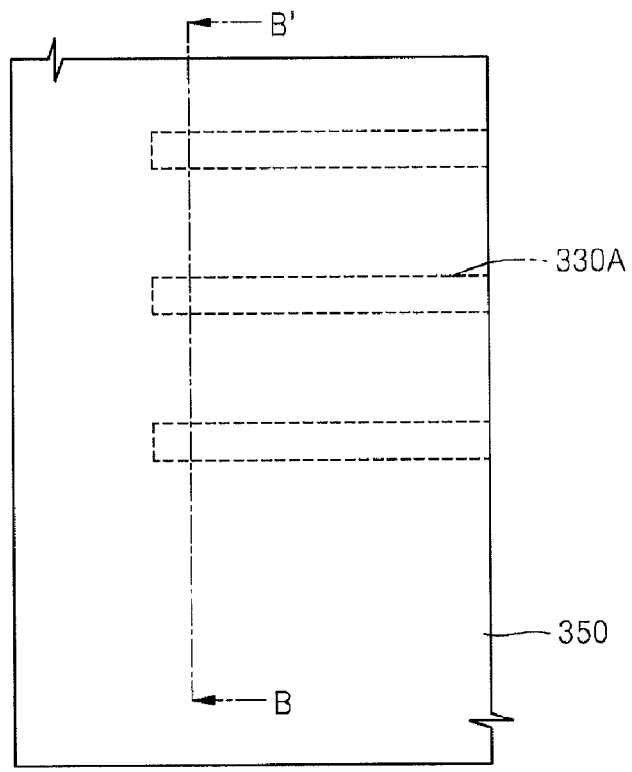
Figure 5B:
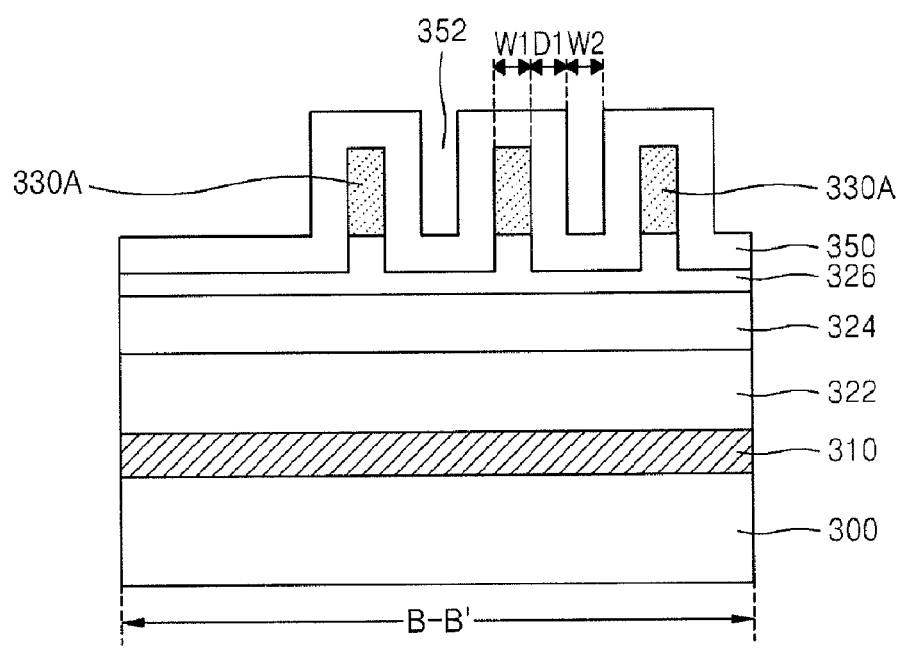

Referring to FIGS. 5A and 5B, a buffer layer 350 is formed to cover exposed side and top surfaces of the first C-containing film patterns 330A and the low surface portions 326R of the third hardmask layer 326, to a uniform thickness.

Although the buffer layer 350 covers the side surfaces of the first C-containing film patterns 330A to a thickness D1 that is almost equal to the first width W1 of the first C-containing film patterns 330A in FIGS. 5A and 5B, the inventive concept is not limited thereto. The buffer layer 350 may be formed to a thickness that is equal to or less than the first width W1 of the first C-containing film patterns 330A.

Each of a plurality of recesses 352 in a top surface of the buffer layer 350 between the first C-containing film patterns 330A has a second width W2. Portions of the buffer layer 350 which cover the side surfaces of the first C-containing film patterns 330A, may have the thickness D1 that is almost equal to the first width W1 of the first C-containing film patterns 330A, and the second width W2 may be almost equal to the first width W1.

The buffer layer 350 may be an oxide film formed by using, for example, an atomic layer deposition (ALD) process.

Figure 6A:
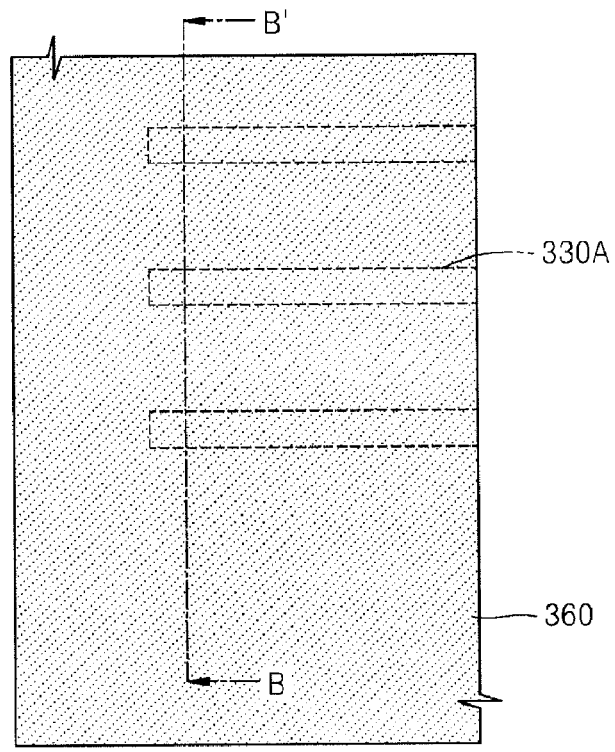
Figure 6B:
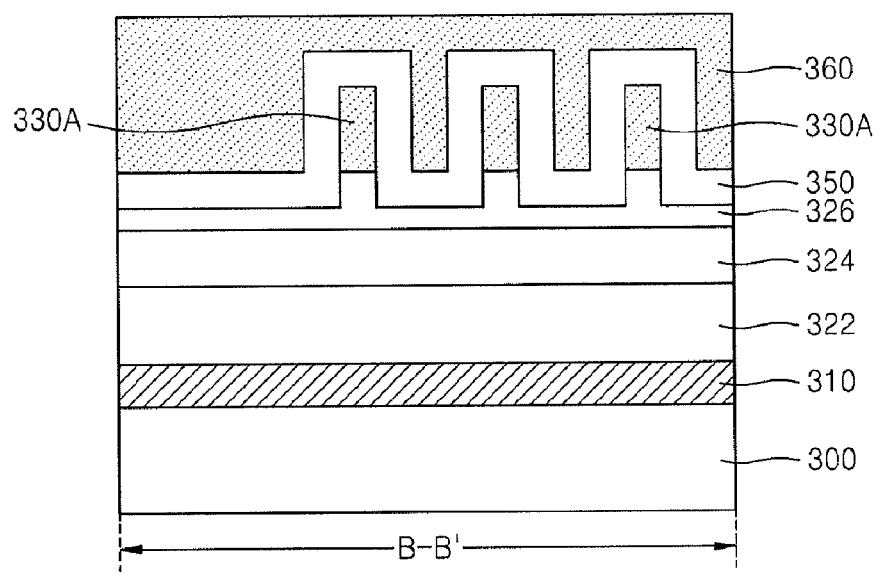

Referring to FIGS. 6A and 6B, a second C-containing film 360 is formed on the buffer layer 350.

The second C-containing film 360 may be formed of a hydrocarbon compound containing an aromatic ring or an organic compound containing a derivative thereof. For example, the second C-containing film 360 may be formed of an organic compound containing an aromatic ring such as phenyl, benzene, or naphthalene. The second C-containing film 360 may be a film having a C content of about 85~99 weight % of an organic compound forming the second C-containing film 360.

The second C-containing film 360 may be formed by using a spin coating process. The second C-containing film 360 may be formed by spin-coating an organic compound on the buffer layer 350 to a thickness of about 1000~5000 Å so as to completely cover the buffer layer 350, and baking the organic compound layer at about 150~350° C. in a primary baking process. The primary baking process may be performed for about 60 sec. Then, the second C-containing film 360 is baked at about 300~550° C. in a secondary baking process so as to be cured. The secondary baking process may be performed for about 30~300 sec.

The second C-containing film 360 may be formed of the same material as the first C-containing film 330, which is described above with reference to FIGS. 3A and 3B.

Figure 7A:
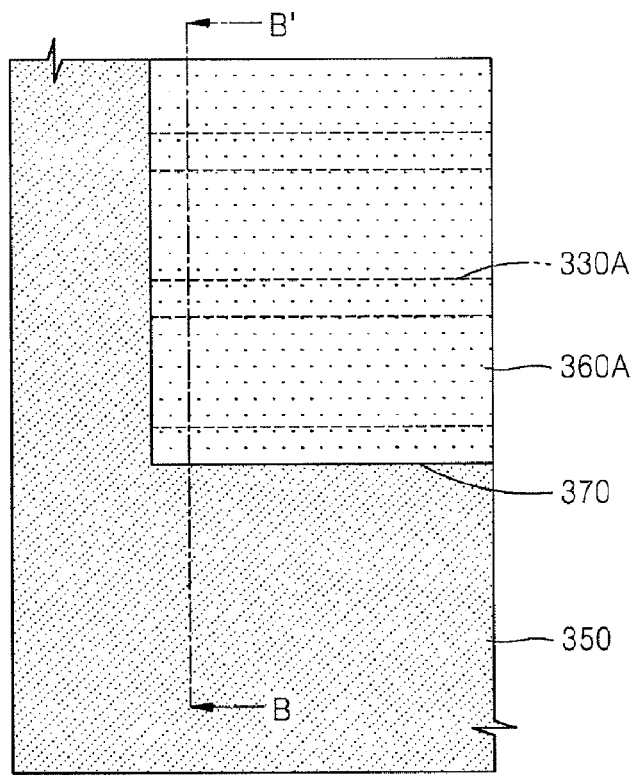
Figure 7B:
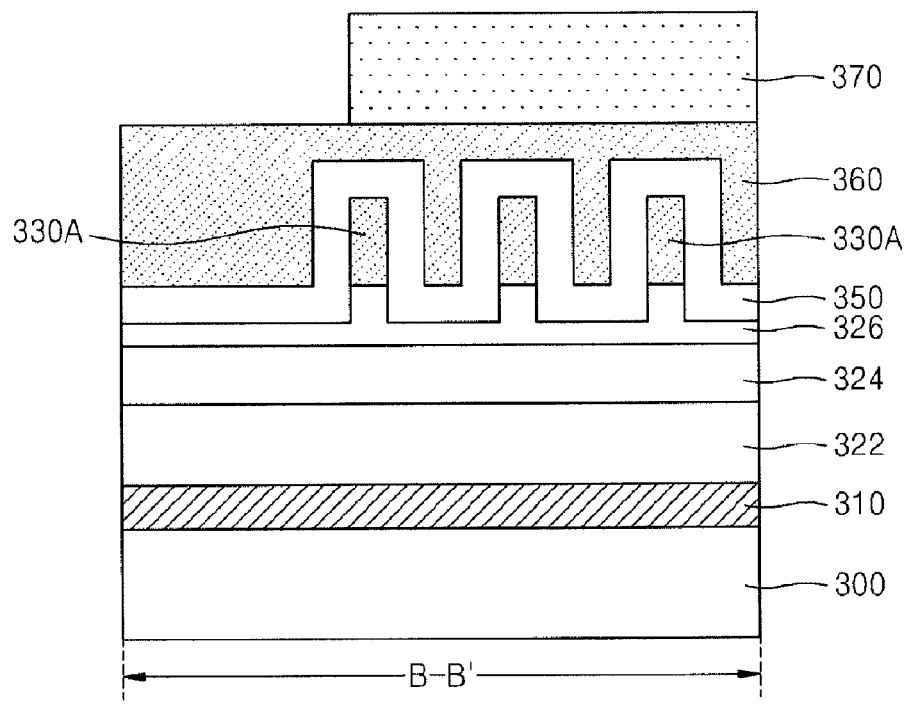

Referring to FIGS. 7A and 7B, a trimming mask pattern 370 is formed on the second C-containing film 360.

The trimming mask pattern 370 is formed to expose only a portion of the second C-containing film 360 which is to be removed. For example, the trimming mask pattern 370 may be formed to expose the portion of the second C-containing film 360 to be removed on a low density pattern region in which pattern density is not required to be increased on the substrate 300 by performing a double patterning process.

The trimming mask pattern 370 may be formed of a material having an etch selectivity different from that of the second C-containing film 360 under a predetermined etching condition. The trimming mask pattern 370 may be formed of a material containing an inorganic material. For example, the trimming mask pattern 370 may be formed of a photoresist material containing Si. In particular, the trimming mask pattern 370 may be formed of a resist material having a Si—O group in a main chain and having a hydrocarbon group containing a benzene ring. For example, the trimming mask pattern 370 may be formed of a TDUR-SC series product manufactured by Tokyo Ohka Kogyo (TOK) Co., Ltd. in Japan.

Figure 8A:
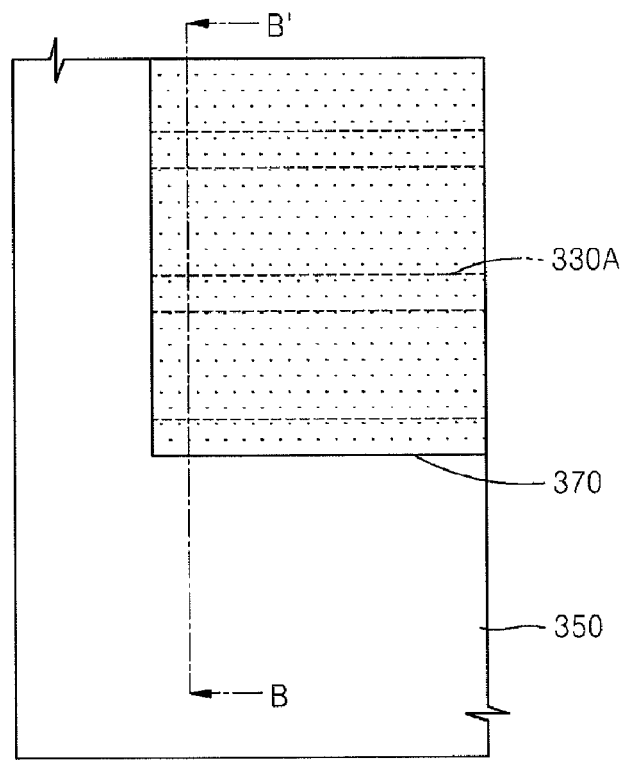
Figure 8B:
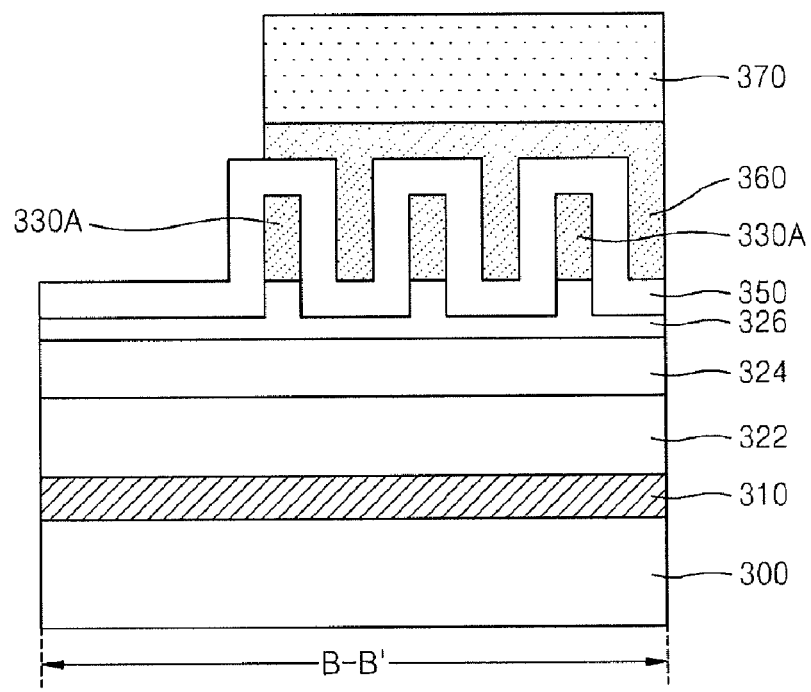

Referring to FIGS. 8A and 8B, the exposed portion of the second C-containing film 360 is etched by using the trimming mask pattern 370 as an etching mask under a condition in which etching of the buffer layer 350 is suppressed. As a result, a portion of the second C-containing film 360 is removed so as to expose the buffer layer 350 in a region that is not covered by the trimming mask pattern 370. Since the first C-containing film patterns 330A are covered by the buffer layer 350, the first C-containing film patterns 330A may not be worn or damaged when the second C-containing film 360 is etched.

In order to etch the exposed portion of the second C-containing film 360 by using the trimming mask pattern 370 as an etching mask, for example, a dry etching process using a carbon oxide (CO) and nitrogen ($N_2$) gas as a main etching gas may be performed. An argon (Ar) gas may be further included in an etching atmosphere of the dry etching process, and the dry etching process may be performed in a plasma atmosphere.

Figure 9A:
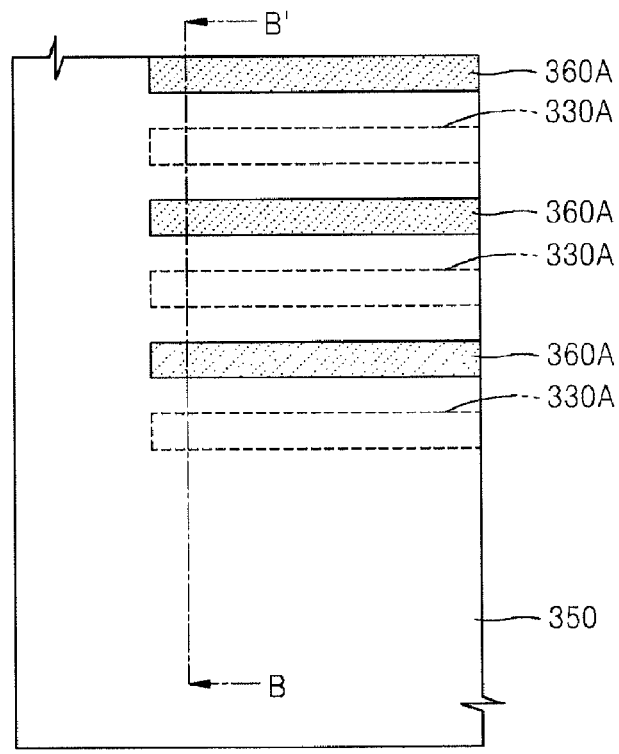
Figure 9B:
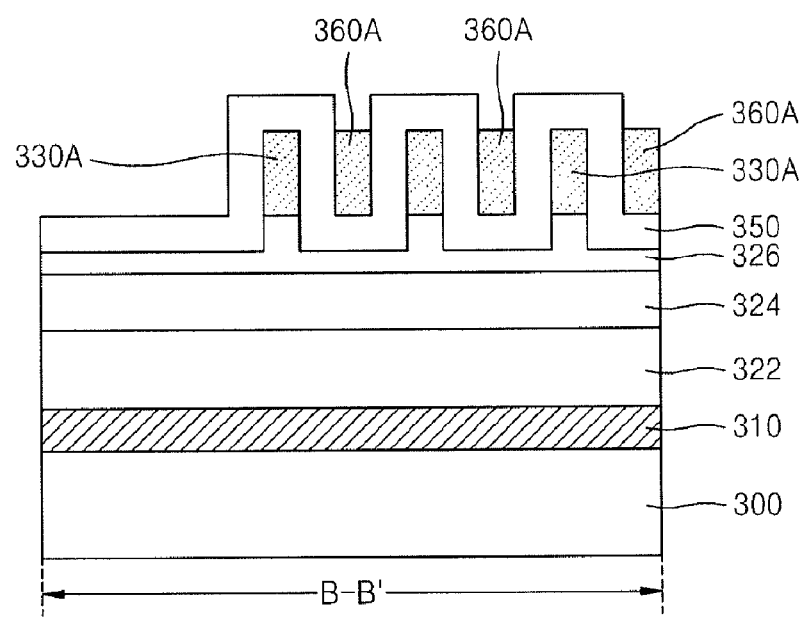

Referring to FIGS. 9A and 9B, the second C-containing film 360 is exposed by removing the trimming mask pattern 370, and then a plurality of second C-containing film patterns 360A are formed in the recesses 352 by removing a portion of the exposed second C-containing film 360 from a top surface of the second C-containing film 360 until upper portions of the buffer layer 350 are exposed. As a result, the second C-containing film patterns 360A are formed in the recesses 352 to be separated apart from each other. The upper portions of the buffer layer 350 covering the first C-containing film patterns 330A are exposed between the second C-containing film patterns 360A.

In order to remove the portion of the exposed second C-containing film 360 from the top surface of the second C-containing film 360, an etchback process based on a dry etching process may be used.

Figure 10A:
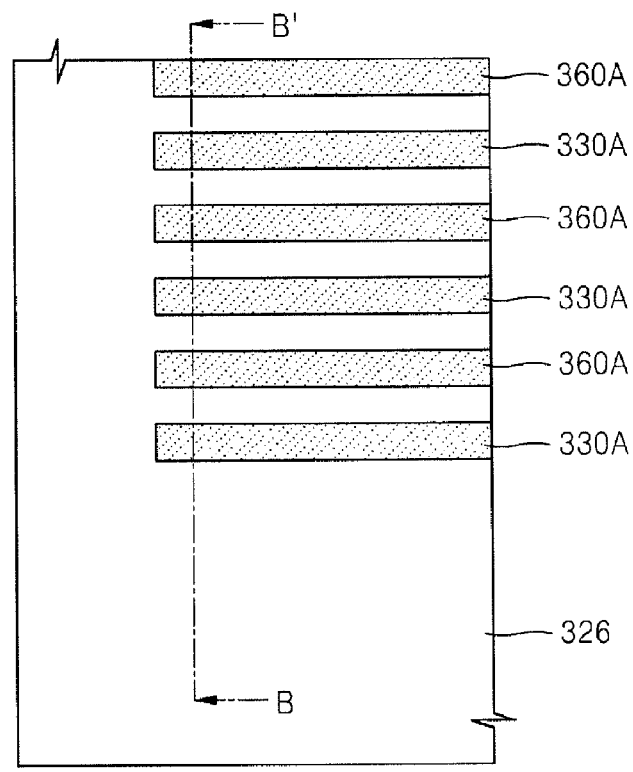
Figure 10B:
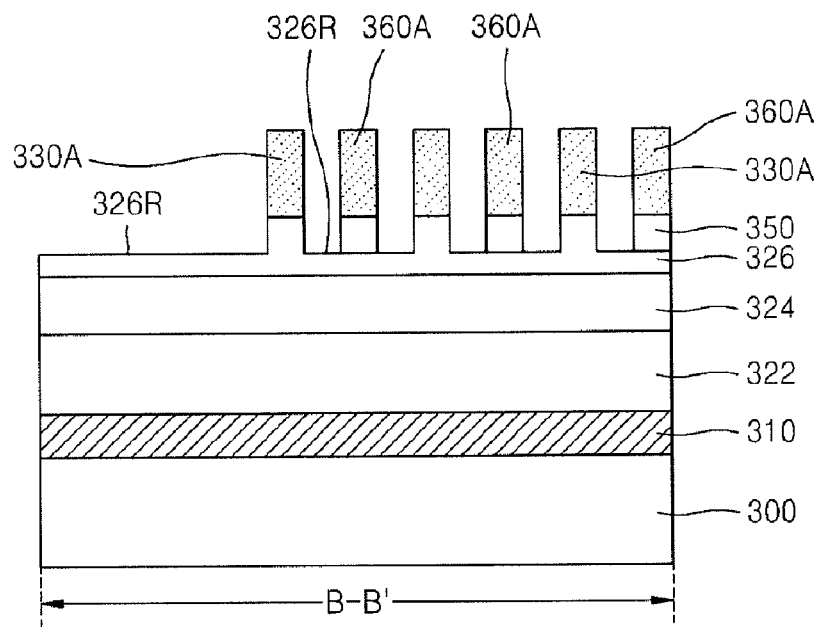

Referring to FIGS. 10A and 10B, top surfaces of the first C-containing film patterns 330A are exposed by removing the exposed portions of the buffer layer 350, i.e., portions covering the top surfaces of the first C-containing film patterns 330A. As a result, the top surfaces of the first C-containing film patterns 330A and top surfaces of the second C-containing film patterns 360A are simultaneously exposed. Then, top surfaces of the low surface portions 326R of the third hardmask layer 326 are exposed by removing portions of the buffer layer 350 between the first and second C-containing film patterns 330A and 360A.

In order to remove the portions of the buffer layer 350, a wet etching process or a dry etching process may be used. For example, if the buffer layer 350 is an oxide film, in order to wet-etch the buffer layer 350 with a relatively high etch selectivity with respect to the first and second C-containing film patterns 330A and 360A, an etchant containing fluorine (F) may be used. For example, the etchant may be formed of a diluted hydrofluoride (DHF), an ammonium fluoride ($NH_4F$), or a mixture thereof. In particular, the etchant may be formed of a DHF in which deionized water and a hydrofluoride (HF) are mixed in a volume ratio of 50:1. Alternatively, if a dry etching process is used in order to remove the portions of the buffer layer 350, a fluorocarbon (CxFy) (each of x and y is an integer from 1 to 10) gas may be used as an etching gas. Alternatively, a mixed gas of CxFy and oxygen ($O_2$) or a mixed gas of CxFy, $O_2$, and Ar may be used as the etching gas. For example, $C_3F_6$, $C_4F_6$, $C_4F_8$, or $C_5F_8$ may be used as the CxFy gas. Here, $O_2$ to be included in the etching gas may remove a polymer by-product generated in an etching process and resolve the CxFy gas. Also, Ar to be included in the etching gas may be used as a carrier gas and cause ion bombarding.

Also, when the portions of the buffer layer 350 are removed by using a dry etching process in order to expose the top surfaces of the low surface portions 326R of the third hardmask layer 326, etching may be performed in a plasma atmosphere by generating plasma of the above-described etching gas in an etching chamber. Alternatively, in some cases, the etching may be performed in an etching gas atmosphere without ion energy by not generating the plasma in the etching chamber.

Figure 11A:
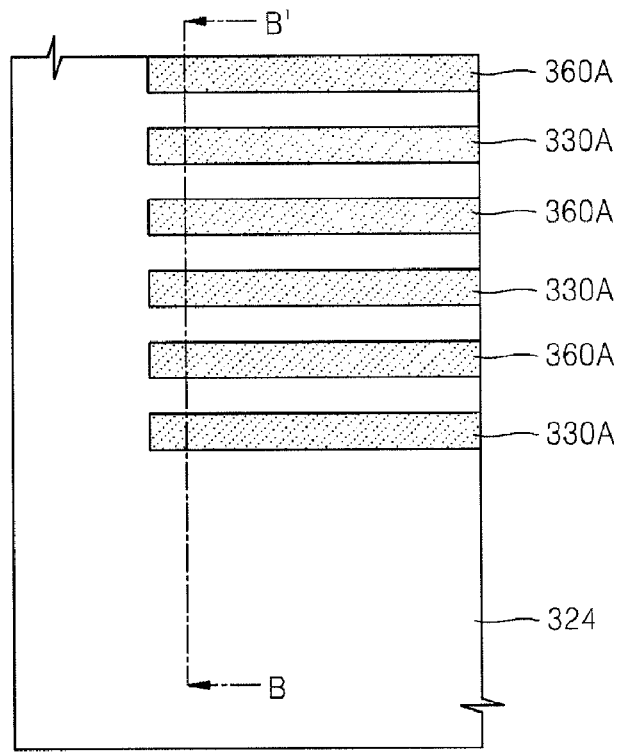
Figure 11B:
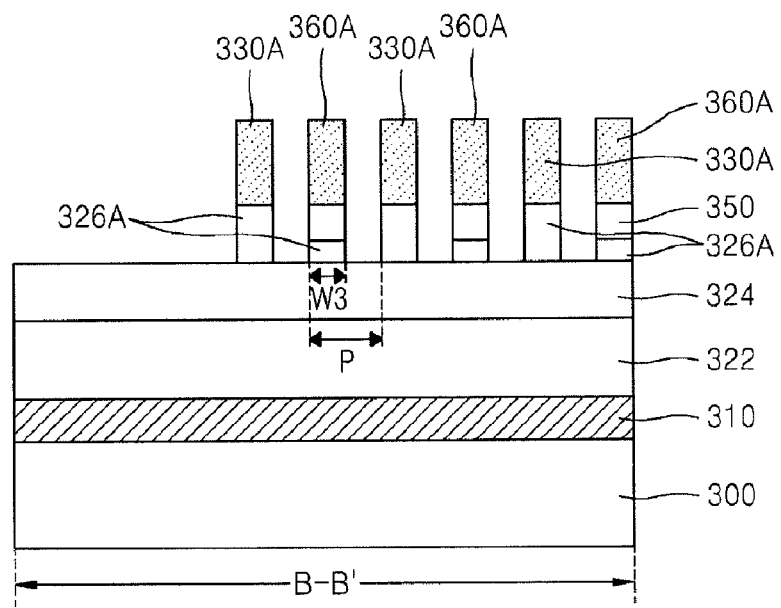

Referring to FIGS. 11A and 11B, a plurality of third hardmask patterns 326A are formed by etching the third hardmask layer 326 by using the first and second C-containing film patterns 330A and 360A as an etching mask. After the third hardmask patterns 326A are formed, only portions of the first and second C-containing film patterns 330A and 360A which are not worn while the third hardmask layer 326 is being etched, may remain on the third hardmask patterns 326A.

The third hardmask patterns 326A may have a third width W3 that is equal to or less than a quarter of the first pitch 2P. The third hardmask patterns 326A may have the fine pitch P that is a half of the first pitch 2P.

Figure 12A:
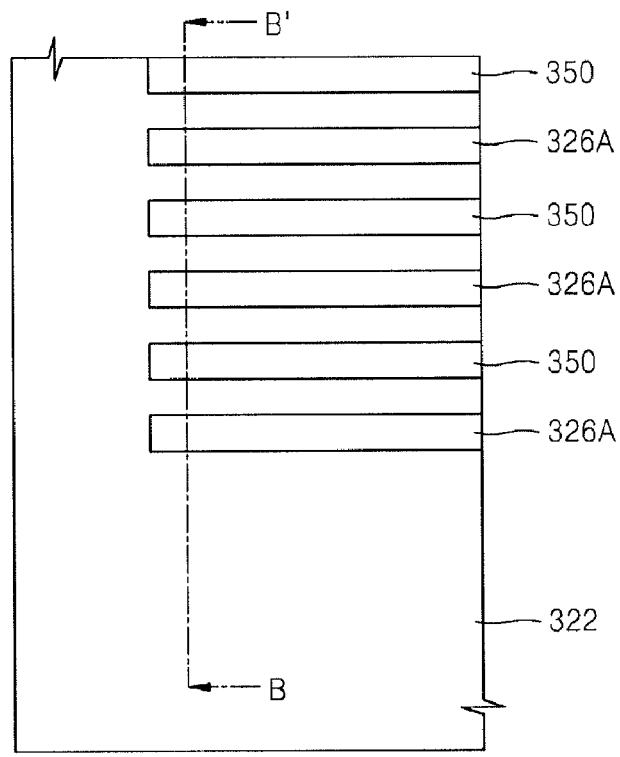
Figure 12B:
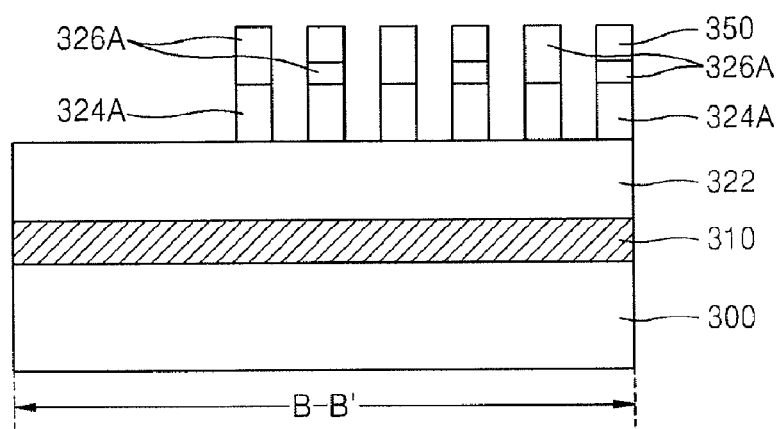

Referring to FIGS. 12A and 12B, a plurality of second hardmask patterns 324A are formed by etching the second hardmask layer 324 by using the third hardmask patterns 326A, and the buffer layer 350 and the first and second C-containing film patterns 330A and 360A, which remain on the third hardmask patterns 326A, as an etching mask.

Although not illustrated in FIGS. 12A and 12B, residual portions of the buffer layer 350 and the first and second C-containing film patterns 330A and 360A may remain on top surfaces of the third hardmask patterns 326A.

Figure 13A:
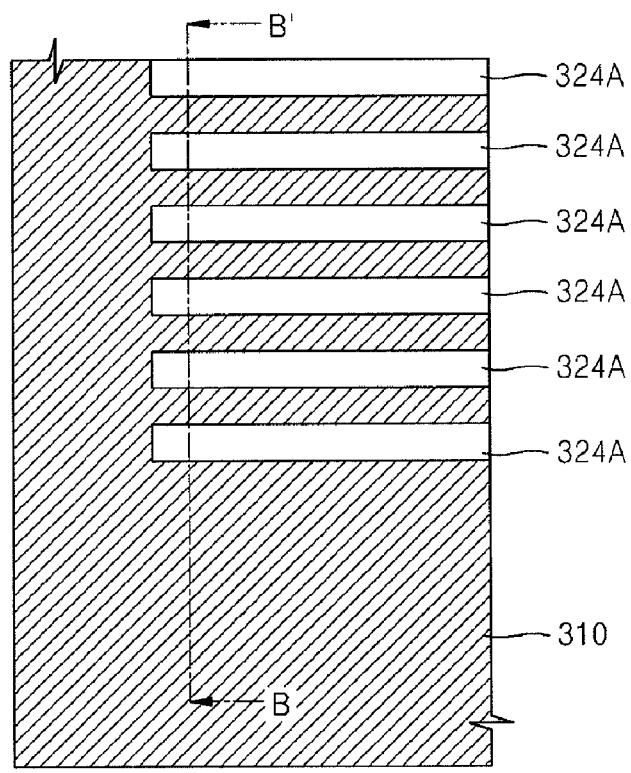
Figure 13B:
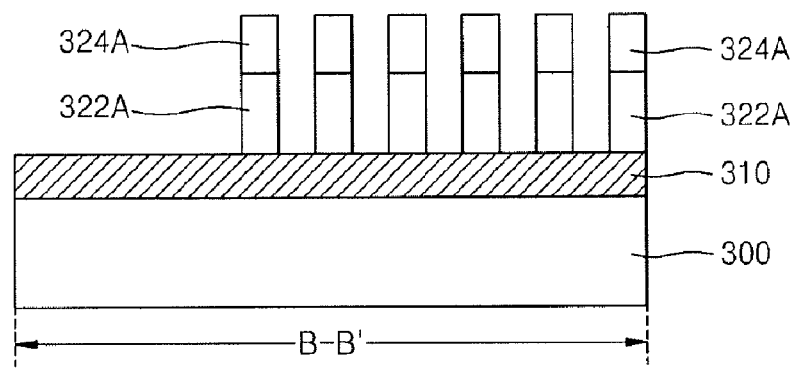

Referring to FIGS. 13A and 13B, a plurality of first hardmask patterns 322A are formed by etching the first hardmask layer 322 by using the second hardmask patterns 324A as an etching mask.

Although not illustrated in FIGS. 13A and 13B, residual portions of the third hardmask patterns 326A may remain on top surfaces of the second hardmask patterns 324A.

Figure 14A:
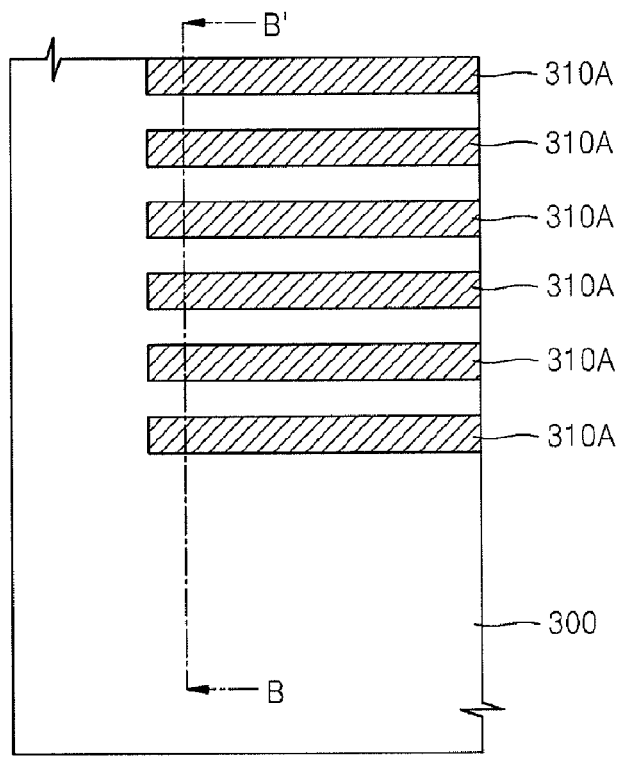
Figure 14B:
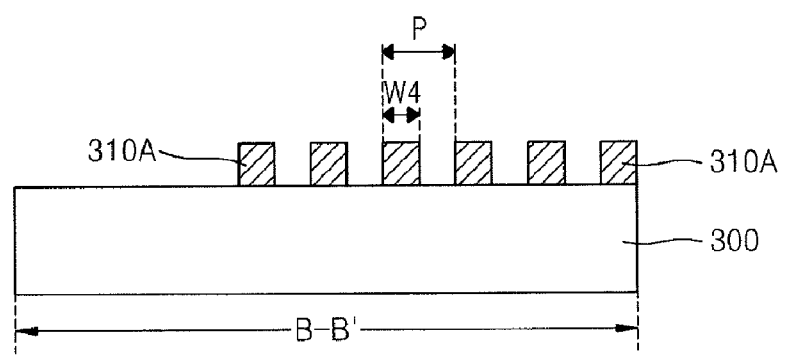

Referring to FIGS. 14A and 14B, a plurality of fine patterns 310A are formed by etching the etching target film 310 by using the first hardmask patterns 322A as an etching mask. Then, unnecessary films remaining on the fine patterns 310A are removed.

Each of the fine patterns 310A may have a fourth width W4 that is equal to or less than a quarter of the first pitch 2P. The fine patterns 310A may have the fine pitch P that is a half of the first pitch 2P.

The fine patterns 310A may form the word lines WL1 through WLm 220 or the bit lines BL1 through BLn 230 illustrated in FIG. 2.

Although not illustrated in FIGS. 14A and 14B, if the etching target film 310 is not formed and the first hardmask layer 322 is formed directly on the substrate 300, a plurality of trenches (not shown) may be formed on the substrate 300 in order to define the active regions 212 illustrated in FIG. 2 by etching the substrate 300 by using the first hardmask patterns 322A as an etching mask.

FIGS. 15A and 15B through 19A and 19B are plan views and cross-sectional views illustrating a method of forming patterns of a semiconductor device, according to another embodiment of the inventive concept. The current embodiment of FIGS. 15A and 15B through 19A and 19B is generally similar to the previous embodiment of FIGS. 3A and 3B through 14A and 14B. However, a plurality of second C-containing film patterns 460A of the current embodiment (a trimming process illustrated in FIGS. 15A and 15B) are different from the second C-containing film patterns 360A of the previous embodiment. Like reference numerals in FIGS. 3A and 3B through 14A and 14B and FIGS. 15A and 15B through 19A and 19B denote like elements. Thus, FIGS. 15A and 15B through 19A and 19B will be described in conjunction with FIGS. 3A and 3B through 14A and 14B and detailed descriptions of common features will not be repeated.

Figure 15A:
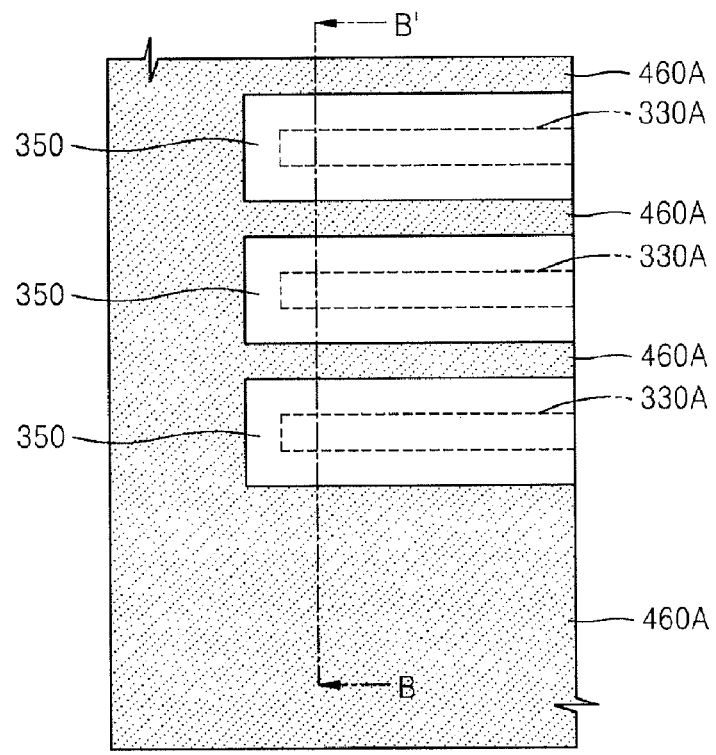
FIGS. 15A, 16A, 17A, 18A and 19A are plan views illustrating a method of forming patterns of a semiconductor device, according to another embodiment of the inventive concept.
Figure 15B:
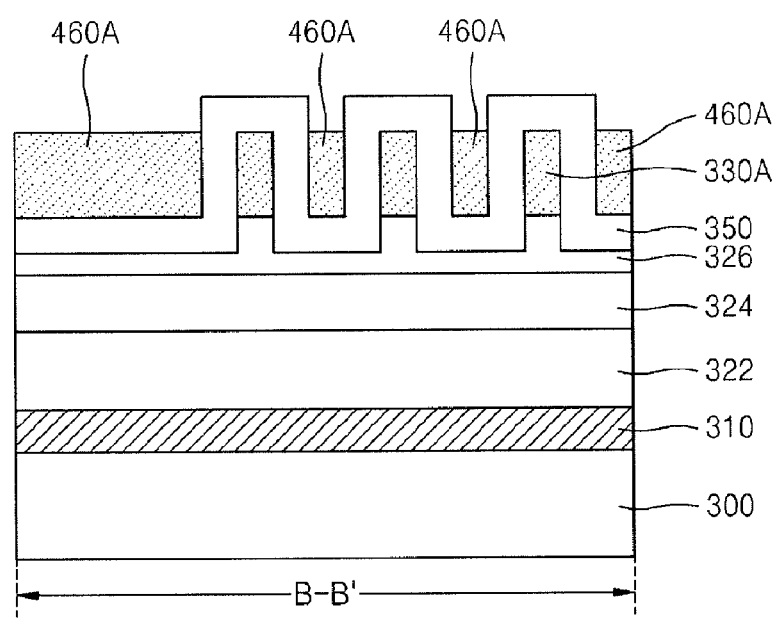
FIGS. 15B, 16B, 17B, 18B and 19B are cross-sectional views taken along line B-B' of FIGS. 15A, 16A, 17A, 18A and 19A, respectively.

Referring to FIGS. 15A and 15B, the processes described above with reference to FIGS. 3A and 3B through 6A and 6B are performed until the second C-containing film 360 is formed. Then, the second C-containing film patterns 460A are formed by removing a portion of the exposed second C-containing film 360 from a top surface of the second C-containing film 360 until upper portions of the buffer layer 350 are exposed. Unlike the second C-containing film patterns 360A illustrated in FIGS. 9A and 9B, the second C-containing film patterns 460A are formed on a region where the first C-containing film patterns 330A are not formed as well as in the recesses 352. Thus, the second C-containing film patterns 460A are also formed in a low density pattern region in which pattern density is not required to be increased on the substrate 300 by performing a double patterning process.

In order to remove the portion of the exposed second C-containing film 360 from the top surface of the second C-containing film 360, an etchback process based on a dry etching process may be used.

Figure 16A:
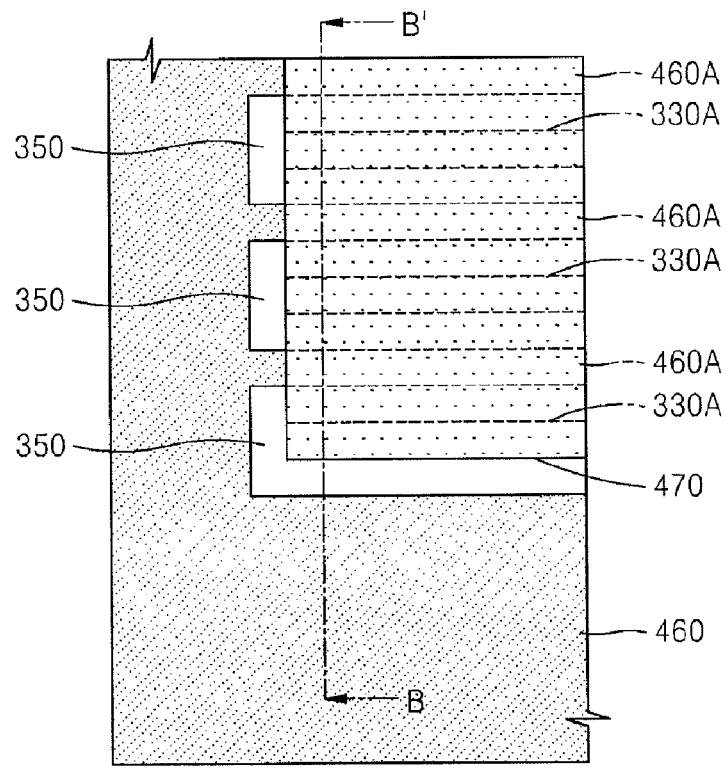
Figure 16B:
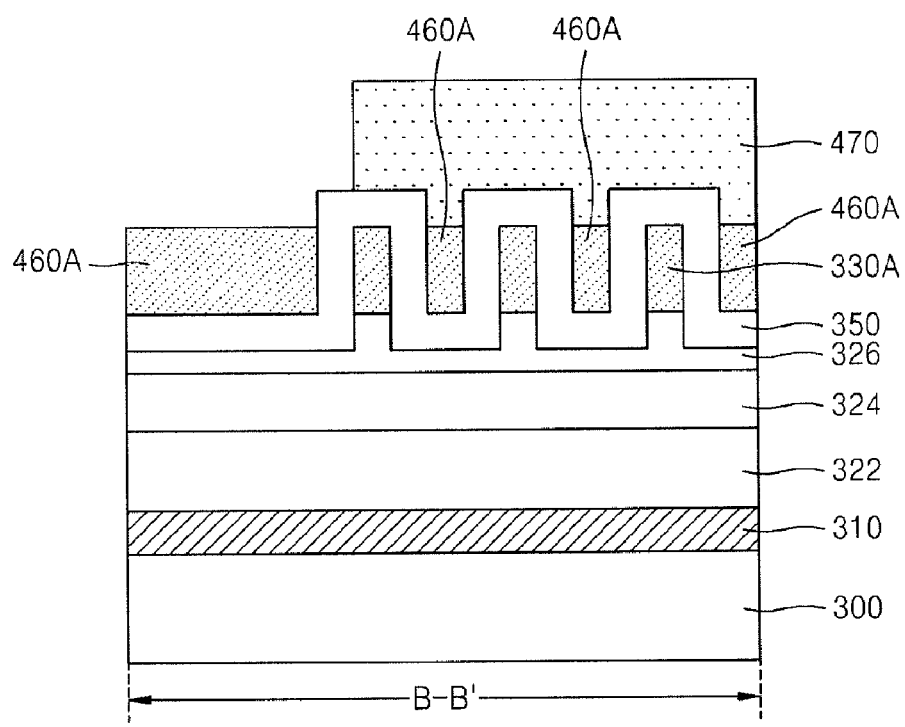

Referring to FIGS. 16A and 16B, a trimming mask pattern 470 is formed on the second C-containing film patterns 460A by using a process similar to the process for forming the trimming mask pattern 370, which is described above with reference to FIGS. 7A and 7B.

The trimming mask pattern 470 is formed to expose only a portion of the second C-containing film patterns 460A which is to be removed. For example, the trimming mask pattern 470 may be formed to expose the portion of the second C-containing film 360 in the low density pattern region in which pattern density is not required to be increased on the substrate 300 by performing a double patterning process.

The trimming mask pattern 470 may have the same structure as the trimming mask pattern 370 illustrated in FIGS. 7A and 7B.

Figure 17A:
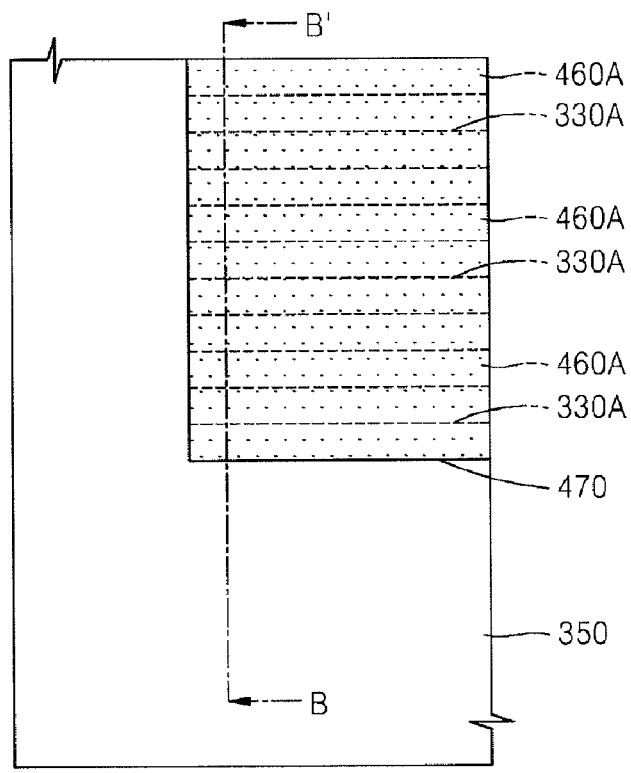
Figure 17B:
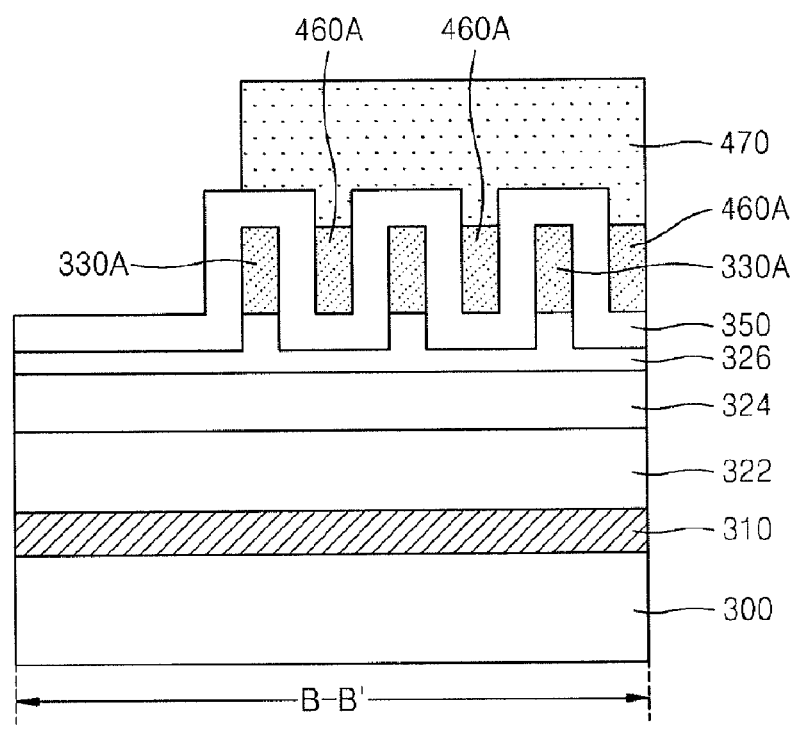

Referring to FIGS. 17A and 17B, by using a method similar to the method described above with reference to FIGS. 8A and 8B, exposed portions of the second C-containing film patterns 460A are etched by using the trimming mask pattern 470 as an etching mask under a condition in which etching of the buffer layer 350 is suppressed. As a result, the second C-containing film patterns 460A are removed so as to expose the buffer layer 350 in a region that is not covered by the trimming mask pattern 470. Since the first C-containing film patterns 330A are covered by the buffer layer 350, the first C-containing film patterns 330A may not be worn or damaged when the second C-containing film patterns 460A are etched.

In order to etch the exposed portions of the second C-containing film patterns 460A by using the trimming mask pattern 470 as an etching mask, the same etching condition used when the exposed portion of the second C-containing film 360 is etched, which is described above with reference to FIGS. 8A and 8B, may be used.

Figure 18A:
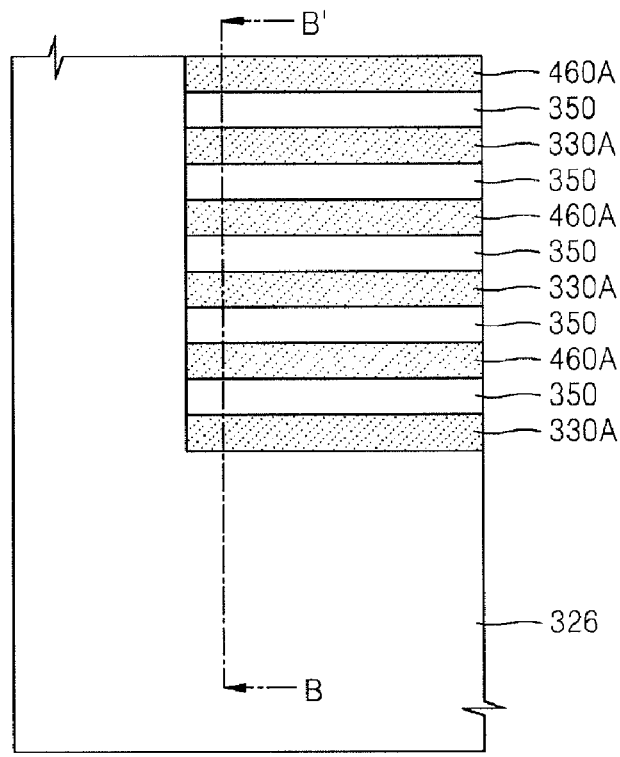
Figure 18B:
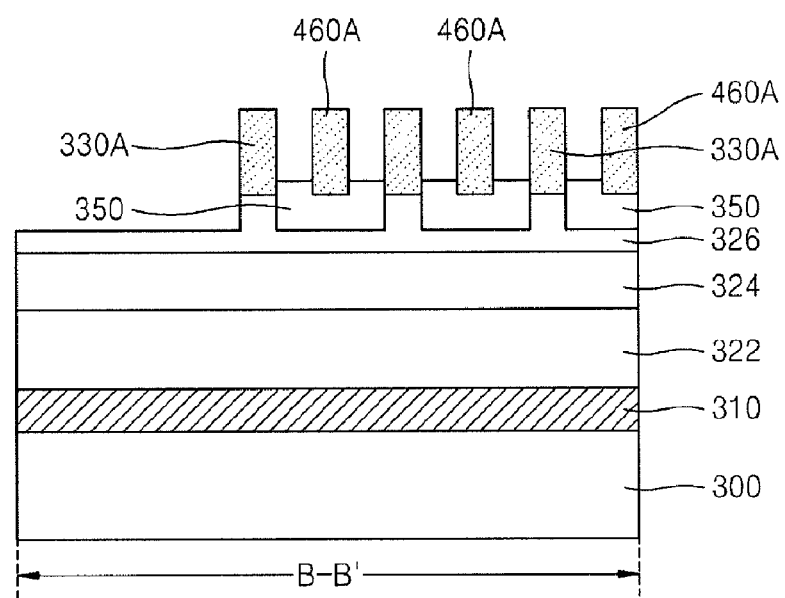

Referring to FIGS. 18A and 18B, the trimming mask pattern 470 is removed by using a process similar to the process described above with reference to FIGS. 9A and 9B. However, in the current embodiment, after the trimming mask pattern 470 is removed, the buffer layer 350 is etched in-situ and thus a portion of the buffer layer 350 remains between the first and second C-containing film patterns 330A and 460A on lower parts of the first and second C-containing film patterns 330A and 460A. The buffer layer 350 may be etched using the same etching condition as that used to remove the trimming mask pattern 470.

In order to continuously perform the removal of the trimming mask pattern 470 and the etching of the buffer layer 350 in-situ, a dry etching process may be used. If the buffer layer 350 is an oxide film, for example, a CxFy (each of x and y is an integer from 1 to 10) gas may be used as an etching gas. Alternatively, a mixed gas of CxFy and $O_2$ or a mixed gas of CxFy, $O_2$, and Ar may be used as the etching gas. For example, $C_3F_6$, $C_4F_6$, $C_4F'_8$, or $C_5F_8$ may be used as the CxFy gas. Here, $O_2$ to be included in the etching gas may remove a polymer by-product generated in an etching process and resolve the CxFy gas. Also, Ar to be included in the etching gas may be used as a carrier gas and cause ion bombarding. Alternatively, in order to continuously perform the removal of the trimming mask pattern 470 and the etching of the buffer layer 350 in-situ, a wet etching process may be used. If the buffer layer 350 is an oxide film, in order to remove the trimming mask pattern 470 and to etch the buffer layer 350 with a relatively high etch selectivity with respect to the first and second C-containing film patterns 330A and 460A, an etchant containing F may be used. For example, the etchant may be formed of a DHF in which deionized water and a HF are mixed in a volume ratio of 50:1. In this case, after the substrate 300, on which the trimming mask pattern 470 and the buffer layer 350 are formed, is dipped in the DHF, a rinsing process using deionized water and a purging process using a $N_2$ gas may be sequentially performed.

While the buffer layer 350 is being etched, the portion of the buffer layer 350 in the low density pattern region in which the first C-containing film patterns 330A are not formed, may be completely removed so as to expose a top surface of the third hardmask layer 326.

Figure 19A:
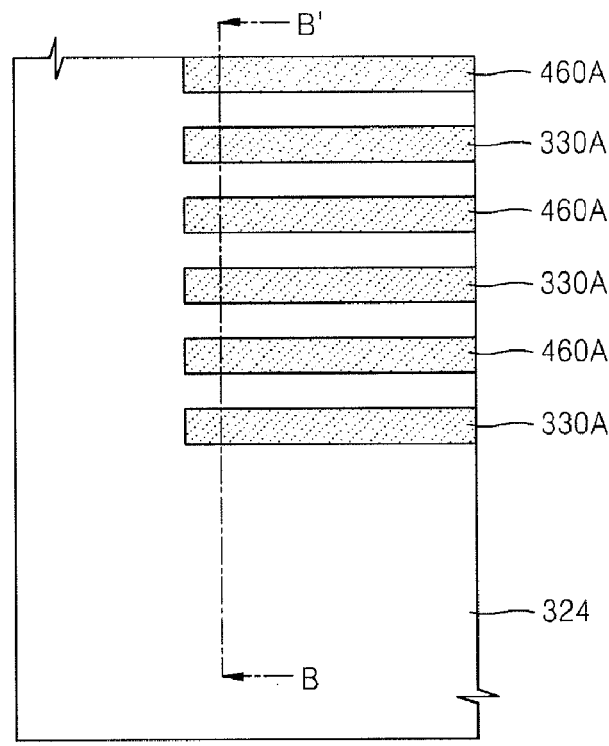
Figure 19B:
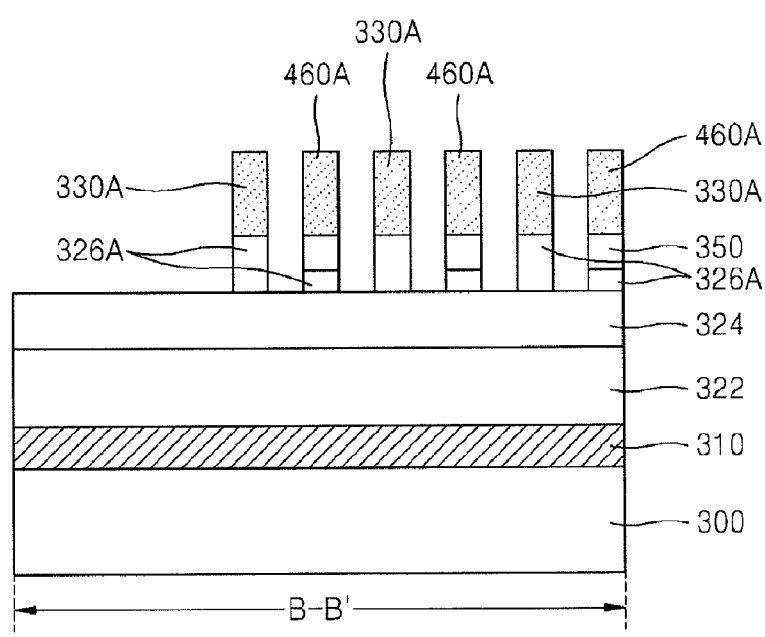

Referring to FIGS. 19A and 19B, by using a method similar to the method described above with reference to FIGS. 10A, 10B, 11A, and 11B, the third hardmask patterns 326A are formed by etching exposed portions of the buffer layer 350 and the third hardmask layer 326 under the exposed portions of the buffer layer 350 by using the first and second C-containing film patterns 330A and 460A as an etching mask.

Then, fine patterns are formed by performing a series of processes described above with reference to FIGS. 12A and 12B through 14A and 14B.

While the inventive concept has been particularly shown and described with reference to exemplary embodiments thereof, it will be understood that various changes in form and details may be made therein without departing from the spirit and scope of the inventive concept, as defined in the following claims.

What is claimed is:

1. A method of forming patterns of a semiconductor device, the method comprising:
    forming an etching target film on a substrate comprising first and second regions;
    forming a plurality of first carbon (C)-containing film patterns on the etching target film in the first region;
    forming a buffer layer which covers top and side surfaces of the plurality of first C-containing film patterns and in which a plurality of recesses are formed in a top surface thereof between the first C-containing film patterns;
    forming a second C-containing film on the buffer layer in the first and second regions so as to fill the plurality of recesses;
    exposing the buffer layer in the second region by removing the second C-containing film in the second region;
    exposing the plurality of first C-containing film patterns by removing a portion of the buffer layer in the first and second regions; and
    forming a plurality of etching target film patterns by etching the etching target film by using the plurality of first C-containing film patterns, and portions of the second C-containing film, which are filled in the plurality of recesses, as an etching mask,
    wherein the forming of the second C-containing film comprises forming the second C-containing film so as to fill the plurality of recesses and to completely cover the buffer layer in the first and second regions, and
    wherein the exposing of the buffer layer in the second region by removing the second C-containing film in the second region comprises:
        forming a trimming mask pattern on the second C-containing film in the first region;
        etching the second C-containing film in the second region by using the trimming mask pattern as an etching mask; and
        exposing the second C-containing film in the first region by removing the trimming mask pattern.

2. The method of claim 1, after removing the trimming mask pattern, further comprising forming a plurality of second C-containing film patterns so as to be separately disposed in the plurality of recesses by removing a portion of the second C-containing film in the first region from a top surface of the second C-containing film, before exposing the plurality of first C-containing film patterns by removing the portion of the buffer layer,
    wherein the plurality of first C-containing film patterns and the plurality of second C-containing film patterns are used as an etching mask when the etching target film is etched.

3. A method of forming patterns of a semiconductor device, the method comprising:
    forming an etching target film on a substrate comprising first and second regions;
    forming a plurality of first carbon (C)-containing film patterns on the etching target film in the first region;
    forming a buffer layer which covers top and side surfaces of the plurality of first C-containing film patterns and in which a plurality of recesses are formed in a top surface thereof between the first C-containing film patterns;
    forming a second C-containing film on the buffer layer in the first and second regions so as to fill the plurality of recesses;
    exposing the buffer layer in the second region by removing the second C-containing film in the second region;
    exposing the plurality of first C-containing film patterns by removing a portion of the buffer layer in the first and second regions; and
    forming a plurality of etching target film patterns by etching the etching target film by using the plurality of first C-containing film patterns, and portions of the second C-containing film, which are filled in the plurality of recesses, as an etching mask, wherein the forming of the second C-containing film comprises forming the second C-containing film so as to fill the plurality of recesses and to completely cover the buffer layer in the first and second regions, and
    wherein the exposing of the buffer layer in the second region by removing the second C-containing film in the second region comprises:
        forming a plurality of second C-containing film patterns so as to be separately disposed in the plurality of recesses in the first region and to be disposed on the buffer layer in the second region, by removing a portion of the second C-containing film in the first and second regions from a top surface of the second C-containing film;
        forming a trimming mask pattern on the second C-containing film and the buffer layer in the first region;
        etching the second C-containing film patterns in the second region by using the trimming mask pattern as an etching mask; and
        exposing the second C-containing film patterns and the buffer layer in the first region by removing the trimming mask pattern.

4. The method of claim 3, wherein the plurality of first C-containing film patterns, and the second C-containing film patterns in the first region are used as an etching mask when the etching target film is etched.

5. The method of claim 3, wherein the exposing of the plurality of first C-containing film patterns by removing the portion of the buffer layer is continuously performed in-situ after removing the trimming mask pattern.

6. The method of claim 5, wherein an etching process for removing the portion of the buffer layer and an etching process for removing the trimming mask pattern are performed under the same etching condition.

7. A method of forming patterns of a semiconductor device, the method comprising:
  forming an etching target film on a substrate comprising first and second regions;
  forming a plurality of first carbon (C)-containing film patterns on the etching target film in the first region;
  forming a buffer layer which covers top and side surfaces of the plurality of first C-containing film patterns and in which a plurality of recesses are formed in a top surface thereof between the first C-containing film patterns;
  forming a second C-containing film on the buffer layer in the first and second regions so as to fill the plurality of recesses;
  exposing the buffer layer in the second region by removing the second C-containing film in the second region;
  exposing the plurality of first C-containing film patterns by removing a portion of the buffer layer in the first and second regions; and
  forming a plurality of etching target film patterns by etching the etching target film by using the plurality of first C-containing film patterns, and portions of the second C-containing film, which are filled in the plurality of recesses, as an etching mask, wherein the exposing of the buffer layer in the second region by removing the second C-containing film in the second region comprises etching the second C-containing film in the second region by using a trimming mask pattern which covers the second C-containing film in the first region, as an etching mask.

8. The method of claim 7, wherein the trimming mask pattern comprises a photoresist material containing silicon (Si).

9. The method of claim 1, wherein the plurality of first C-containing film patterns and the second C-containing film comprise the same material.

* * * * *